United States Patent
Kubena et al.

(10) Patent No.: US 11,101,786 B1
(45) Date of Patent: Aug. 24, 2021

(54) HF-VHF QUARTZ MEMS RESONATOR

(71) Applicant: HRL Laboratories, LLC, Malibu, CA (US)

(72) Inventors: Randall L. Kubena, Oak Park, CA (US); Deborah J. Kirby, Calabasas, CA (US); Hung Nguyen, Los Angeles, CA (US); David T. Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 667 days.

(21) Appl. No.: 15/899,122

(22) Filed: Feb. 19, 2018

Related U.S. Application Data

(60) Provisional application No. 62/522,573, filed on Jun. 20, 2017.

(51) Int. Cl.
| | |
|---|---|
| *H03H 9/19* | (2006.01) |
| *H03H 9/02* | (2006.01) |
| *H01L 21/311* | (2006.01) |
| *B81C 1/00* | (2006.01) |
| *H03H 3/007* | (2006.01) |

(52) U.S. Cl.
CPC ........... *H03H 9/19* (2013.01); *B81C 1/00238* (2013.01); *H01L 21/31111* (2013.01); *H03H 3/0072* (2013.01); *H03H 9/02102* (2013.01); *H03H 9/02377* (2013.01); *B81B 2201/0271* (2013.01); *B81C 2203/036* (2013.01)

(58) Field of Classification Search
CPC .. H03H 9/19; H03H 9/02377; H03H 9/02102; H01L 21/31111; B81C 2203/036
See application file for complete search history.

(56) References Cited

U.S. PATENT DOCUMENTS

| | | | |
|---|---|---|---|
| 4,314,204 A | 2/1982 | Biehl | |
| 5,659,270 A | 8/1997 | Millen | |
| 5,962,786 A | 10/1999 | Le Traon | |
| 6,194,900 B1 | 2/2001 | Freeman | |
| 6,483,480 B1 | 11/2002 | Sievenpiper | |

(Continued)

FOREIGN PATENT DOCUMENTS

| | | |
|---|---|---|
| EP | 0496583 A2 | 7/1992 |
| WO | 2009-045576 A2 | 4/2009 |
| WO | 2015-072985 A1 | 5/2015 |

OTHER PUBLICATIONS

From U.S. Appl. No. 15/801,642 (non-publication request filed), Notice of Allowance dated Jan. 29, 2019.

(Continued)

*Primary Examiner* — Bryan P Gordon
(74) *Attorney, Agent, or Firm* — Ladas & Parry

(57) ABSTRACT

A MEMS resonator comprising a baseplate wafer; a piezoelectric HF-VHF resonator that comprises a monolithic piezoelectric member having at least two separate spring piezoelectric support members integrally extending therefrom, each spring piezoelectric support member having at least a rounded corner; said piezoelectric resonator being attached to the baseplate wafer by said support members; wherein said monolithic piezoelectric member comprises first and second main surfaces joined by side edges; at least one of said side edges forming an angle of between 90 and 105 degrees with one of the first and second main surfaces.

10 Claims, 12 Drawing Sheets

(56) References Cited

U.S. PATENT DOCUMENTS

| | | | |
|---|---|---|---|
| 6,812,903 B1 | 11/2004 | Sievenpiper | |
| 6,888,424 B2 | 5/2005 | Takeuchi | |
| 7,575,807 B1 | 8/2009 | Barvosa-Carter | |
| 7,716,985 B2 | 5/2010 | Zhang | |
| 7,750,535 B2 | 7/2010 | Kubena | |
| 7,774,155 B2 | 8/2010 | Sato | |
| 7,851,971 B2 | 12/2010 | Chang | |
| 7,892,630 B1 | 2/2011 | McKnight | |
| 7,892,876 B2 | 2/2011 | Mehregany | |
| 8,390,387 B2 | 3/2013 | Lander | |
| 8,760,157 B2 | 6/2014 | Miller | |
| 8,765,615 B1* | 7/2014 | Chang | H01L 21/31056 438/756 |
| 8,803,751 B1 | 8/2014 | Miller | |
| 8,912,711 B1* | 12/2014 | Chang | H03H 9/19 310/367 |
| 9,061,886 B1* | 6/2015 | Nguyen | B81C 1/0015 |
| 9,211,690 B1 | 12/2015 | McKnight | |
| 9,250,074 B1 | 2/2016 | Kubena | |
| 9,250,452 B1 | 2/2016 | Yap | |
| 9,383,208 B2 | 7/2016 | Mohanty | |
| 9,825,610 B1 | 11/2017 | Churchill | |
| 9,879,997 B1 | 1/2018 | Kubena | |
| 9,977,097 B1 | 5/2018 | Nguyen | |
| 9,991,863 B1* | 6/2018 | Kubena | H03H 9/19 |
| 10,031,191 B1 | 7/2018 | Nguyen | |
| 10,110,198 B1 | 10/2018 | Kubena | |
| 10,126,376 B1 | 11/2018 | Nguyen | |
| 10,175,307 B1 | 1/2019 | Sorenson | |
| 10,177,737 B1 | 1/2019 | Kubena | |
| 10,266,398 B1 | 4/2019 | Kubena | |
| 10,308,505 B1 | 6/2019 | Kirby | |
| 10,389,392 B1 | 8/2019 | Kubena | |
| 2002/0166379 A1 | 11/2002 | Paros | |
| 2004/0194548 A1 | 10/2004 | Dayagi | |
| 2004/0263408 A1 | 12/2004 | Sievenpiper | |
| 2005/0082944 A1 | 4/2005 | Thompson | |
| 2005/0122115 A1 | 6/2005 | Maguire | |
| 2005/0174014 A1 | 8/2005 | Korden | |
| 2006/0160136 A1 | 7/2006 | Xiang | |
| 2007/0001773 A1 | 1/2007 | Oxborrow | |
| 2007/0017287 A1 | 1/2007 | Kubena | |
| 2007/0082642 A1 | 4/2007 | Hattori | |
| 2007/0180911 A1 | 8/2007 | Shoji | |
| 2007/0205849 A1 | 9/2007 | Otis | |
| 2007/0216406 A1 | 9/2007 | Witcraft | |
| 2008/0136418 A1 | 6/2008 | Renz | |
| 2008/0163689 A1 | 7/2008 | Thompson | |
| 2009/0003136 A1 | 1/2009 | Karr | |
| 2009/0109048 A1 | 4/2009 | Spivak | |
| 2009/0147254 A1 | 6/2009 | Kirby | |
| 2010/0176809 A1 | 7/2010 | Biber | |
| 2011/0062955 A1 | 3/2011 | Miller | |
| 2013/0201316 A1 | 8/2013 | Binder | |
| 2013/0217979 A1 | 8/2013 | Blackadar | |
| 2014/0111019 A1 | 4/2014 | Roy | |
| 2014/0113828 A1 | 4/2014 | Gilbert | |
| 2015/0295320 A1 | 10/2015 | Lee | |
| 2015/0323694 A1 | 11/2015 | Roy | |
| 2016/0003924 A1 | 1/2016 | Sun | |
| 2016/0118954 A1 | 4/2016 | Clark | |
| 2016/0197595 A1* | 7/2016 | Obata | H03H 9/1021 331/158 |
| 2016/0209478 A1 | 7/2016 | Forstner | |
| 2016/0380357 A1 | 12/2016 | Keller | |
| 2017/0141622 A1 | 5/2017 | Meichle | |
| 2017/0212060 A1 | 7/2017 | Hao | |
| 2017/0244377 A1 | 8/2017 | Yamane | |
| 2017/0276848 A1 | 9/2017 | Sinclair | |
| 2017/0345449 A1 | 11/2017 | Shibata | |
| 2017/0359025 A1 | 12/2017 | Kishi | |
| 2018/0040666 A1 | 2/2018 | Shibata | |
| 2018/0057409 A1 | 3/2018 | Rosseinsky | |
| 2018/0083595 A1 | 3/2018 | Kaida | |
| 2018/0115070 A1 | 4/2018 | Wang | |
| 2018/0198211 A1 | 7/2018 | Wall | |
| 2018/0226720 A1 | 8/2018 | Wall | |
| 2018/0248516 A1 | 8/2018 | Nota | |
| 2018/0302032 A1 | 10/2018 | Oya | |
| 2018/0323768 A1 | 11/2018 | Ikeda | |
| 2019/0072374 A1 | 3/2019 | Mann | |
| 2019/0123714 A1 | 4/2019 | Kizu | |
| 2019/0245254 A1 | 8/2019 | Yamane | |

OTHER PUBLICATIONS

From U.S. Appl. No. 15/801,642 (non-publication request filed), Notice of Allowance dated Dec. 19, 2018.

From U.S. Appl. No. 15/801,642 (non-publication request filed), Office Action dated Jun. 14, 2018.

U.S. Appl. No. 15/801,642, Kuebena, filed Nov. 2, 2017.

U.S. Appl. No. 15/965,652, Kubena, filed Apr. 27, 2018.

U.S. Appl. No. 14/973,701, Wall, filed Jun. 29, 2017.

U.S. Appl. No. 15/638,052, Kubena, filed Dec. 17, 2015.

Azad, U., et al., "Direct Antenna Modulation (DAM) for Enhanced Capacity Performance of Near-Field Communication (NFC) Link," IEEE Transactions on Circuits and Systems—I: Regular Papers vol. 61, No. 3, pp. 902-910, Mar. 2014.

Filter Inductors—1812FS Series Datasheet, Oct. 12, 2015, retrieved online at: www.coilcraft.com/pdfs/1812fs.pdf.

Gamble, J.T., "Wideband Coherent Communication at VLF with the Experimental Transmitting Antenna Modulator (ETAM)," No. RADC-TR-73-287, Rome Air Development Center, Air Force Systems Command, Griffiss Air Force Base, NY, Dec. 1973.

Hansen, R.C. et al., "Small Antenna Handbook," John Wiley & Sons, Inc., 2011, Chapter 3.

Kawashima, H., "New Cuts for Width-Extensional Mode Quartz Crystal Resonators," Electronics & Communications in Japan, Part 3, vol. 76, No. 12, pp. 28-36, Apr. 1993.

Kim, H.J. et. al., "Piezoelectric/Magnetostructure MEMS Resonant Sensor Array for in-Plane Multi-Axis Magnetic Field Detection," IEEE MEMS 2017.

Klemmer, T.J. et. al., "Ultrahigh Frequency Permeability of Sputtered Fe—Co—B Thin Films," Journal of Applied Physics, vol. 87, No. 2, Jan. 15, 2000.

Kubena, R. "UHF Quartz MEMS Oscillators for Dynamics-Based System Enhancements," 2013 IEEE International Frequency Control Symposium, Prague, Czech Republic, Jul. 22-26, 2013 (8 pages).

Kubena, R., et al., "A Fully Integrated Quartz MEMS VHF TCXO," 2017.

Kubena, R., et al., "MEMS-based UHF Monolithic Crystal Filters for Integrated RF Circuits," Journal of Microelectromechanical Systems, vol. 25, No. 1, pp. 118-124, Feb. 2016.

Kubena, R., et al., "Next Generation Quartz Oscillators and Filters for VHF-UHF Systems," 2006 IEEE International Microwave Symposium, San Francisco, CA, Jun. 11-16, 2006, pp. 668-671.

Li, M. et al., "Ultra-Sensitive Mems Magnetoelectric Sensor for Picotesla DC Magnetic Field Detection" MEMS 2017, Applied Physics Letter, 110 (2017).

Liang, C-Y et. al., "Modeling of Magnetoelastic Nanostructures with a Fully Coupled Mechanical-Micromagnetic Model," Nanotechnology 25 (2014).

Nan, T. et. al., "Acoustically Actuated Ultra-Compact NEMS Magnetoelectric Antennas," Nature Communications, 8:296 (2017).

Statek, CXISM Crystal Datasheet, first accessed Mar. 14, 2016.

Ungan, T., et al., "RF Energy Harvesting Design Using High Q Resonators," IEEE MTT-S International Microwave Workshop on Wireless Sensing, Local Positioning, and RFID, IMWS 2009, pp. 1-4. IEEE, 2009 (4 pages).

Yao, Zhi, et al., "Bulk Acoustic Wave Mediated Multiferroic Antennas: Architecture and Performance Bound," IEEE Transactions on Antennas and Propagation, vol. 63, No. 8, Aug. 2015, pp. 3335-3344.

Zhai, J. et. al., "Detection of Pico-Tesla Magnetic Fields using Magnetic-Electric Sensors at Room Temperature," Applied Physics Letters 88, (2006).

(56) References Cited

OTHER PUBLICATIONS

"Miniaturized VHF Quartz MEMs Resonator Design Methodology" D. J. Kirby, R. L. Kubena, Y. K. Yong, F. P. Stratton, H.D.Nguyen, R. J. Joyce, D. T. Chang, J. F. Garstecki, 2017 Frequency Control Symposium, Jul. 10-13, 2017, Besancon, France.
From U.S. Appl. No. 15/801,642 (now U.S. Pat. No. 10,389,392), Notice of Allowance dated Apr. 5, 2019.
Bennett, S.P., et al., "Magnetic Field Response of Doubly Clamped Magneto-Electric Microelectromechanical AlN—FeCo Resonators," Applied Physics Letters 111, 2017, 5 pages.
Griffith, W.C. et. al., "Miniature atomic magnetometer integrated with flux concentrators," Applied Physics Letters 94, 023502 (2009) (3 pages).
Hu, Z. et al., "Voltage Control of Magnetism in FeGaB/PIN-PMN-PT Multiferroic Heterostructure for High-Power and High-Temperature Applications," Applied Physics Letters, 106, 022901 (2015), 4 pages.
Kubena, R.L., et al. "Wide-band multiferroic quartz MEMS antennae" Journal of Physics: Conference Series, 2019, pp. 1-5.
Vrba, J., *SQUID Sensors: Fundamentals, Fabrication and Applications*, edited by H. Weinstock Kluwer Academic, Dordrecht, The Netherlands, 1996 p. 117.
U.S. Appl. No. 16/269,847, Kubena, filed Feb. 7, 2019.
U.S. Appl. No. 16/370,602, Kubena, filed Mar. 29, 2019.
U.S. Appl. No. 16/775,242, Kubena, filed Jan. 28, 2020.

* cited by examiner

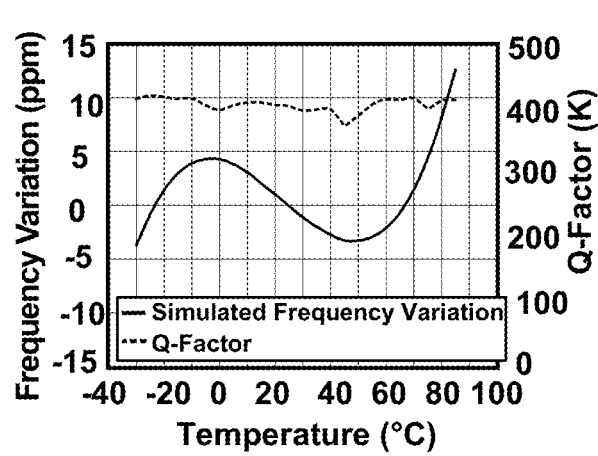 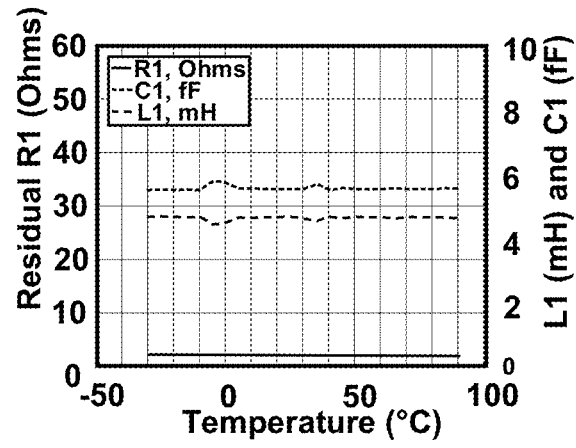
FIG. 10A  FIG. 10B

HF-VHF QUARTZ MEMS RESONATOR

The present application claims priority of U.S. provisional application No. 62/522,573, filed on Jun. 20, 2017, entitled "A NEW HF-VHF QUARTZ MEMS RESONATOR", which is hereby incorporated by reference. The present application relates to U.S. Pat. No. 8,765,615, granted Jul. 1, 2014 and entitled "QUARTZ-BASED MEMS RESONATORS AND METHODS OF FABRICATING SAME", which is hereby incorporated by reference. The present application relates to U.S. Pat. No. 8,912,711, granted Dec. 16, 2014 and entitled "THERMAL STRESS RESISTANT RESONATOR, AND A METHOD FOR FABRICATING SAME", which is hereby incorporated by reference.

STATEMENT REGARDING FEDERALLY SPONSORED RESEARCH OR DEVELOPMENT

THIS INVENTION WAS MADE WITH GOVERNMENT SUPPORT. THE GOVERNMENT HAS CERTAIN RIGHTS IN THE INVENTION.

TECHNICAL FIELD

This presentation relates to piezoelectric resonators; in particular quartz resonator; in particular a HF-VHF quartz resonator.

BACKGROUND

A crystal oscillator is an electronic oscillator circuit that uses the mechanical resonance of a vibrating crystal of piezoelectric material, or piezoelectric resonator, to create an electrical signal with a precise frequency. This frequency can be used to keep track of time, as in quartz wristwatches, to provide a stable clock signal for digital integrated circuits, or to stabilize frequencies for radio transmitters and receivers. A common type of piezoelectric resonator used is a quartz crystal, but other piezoelectric materials including polycrystalline ceramics can be used in similar circuits.

A piezoelectric crystal oscillator, particularly one made of quartz crystal, works by being distorted by an electric field when voltage is applied to an electrode near or on the crystal. This property is known as electrostriction or inverse piezoelectricity. When the field is removed, the quartz—which oscillates in a precise frequency—generates an electric field as it returns to its previous shape, and this can generate a voltage. The result is that a quartz crystal behaves like an RLC circuit.

FIG. 1 illustrates a known crystal oscillator 10 comprising a quartz plate 12 having first and second opposed surfaces in contact with respectively a first electrode 14 and a second electrode 16; as well as the RLC circuit equivalent of resonator 10. Quartz crystals are manufactured for frequencies from a few tens of kilohertz to hundreds of megahertz. The miniaturization of resonators, such as crystal resonators for timing applications, brings with it new challenges in terms of device optimization. As the device size is reduced, design intolerances lead to more significant differences between modeled and fabricated devices, leading to poor performance such as a low quality factor Q. The quality factor is a dimensionless parameter that describes how underdamped an oscillator or resonator is, and characterizes a resonator's bandwidth relative to its center frequency. Higher Q indicates a lower rate of energy loss relative to the stored energy of the resonator. Resonators with high quality factors have low damping, so that they ring or vibrate longer.

FIG. 2 illustrates a perspective view of a quartz resonator 18 as disclosed in the above-cited U.S. Pat. No. 8,912,711, which includes a piezoelectric member 22 having first (top) and second (bottom, not shown) opposed surfaces; a first electrode 20 in electrical contact with a portion of said first (top) surface; and a second electrode (not shown) in electrical contact with a portion of said second (bottom) surface. Piezoelectric member 22 is affixed to a protrusion on a substrate 24 such that the portion of member 22 that bears the electrodes is separated from a top surface of substrate 24 by a distance 26, and may resonate. Resonator 18 is affixed to the protrusion of substrate 24 by respectively a first attachment end 32 of a first spring support 28 and a second attachment end 34 of a second spring support 30, so as to leave the electrode-bearing portion of resonator 22 cantilevered out into space.

A problem with known piezoelectric resonators and especially crystal resonators is that, in particular when the size of the resonator is reduced, minor variations of some fabrication parameters during the fabrication process can result in geometric changes of the resonator and detrimental changes in the resonator performance with respect to a modelled resonator, which may result in a lower quality factor of the resonator. Ultra-high performance HF-VHF commercial quartz resonators are very large (about 1 cm in diameter) to increase their geometrical tolerances for high modal confinement (high Q) and modal isolation over temperature (high temperature stability).

There exists a need for a piezoelectric resonator structure that retains a high quality factor Q despite having a small size and despite minor variations of some fabrication parameters during the fabrication process; and that has at the same time a high temperature stability.

SUMMARY

Embodiments of this presentation provides for a MEMS (Micro-Electro-Mechanical System) resonator comprising a baseplate wafer; a piezoelectric HF-VHF resonator that comprises a monolithic piezoelectric member having at least two separate spring piezoelectric support members integrally extending therefrom; each spring piezoelectric support member having at least a rounded corner; said piezoelectric resonator being attached to the baseplate wafer by said support members; wherein said monolithic piezoelectric member comprises first and second main surfaces joined by side edges; at least one of said side edges forming an angle of between plus and minus 15 degrees from the normal with one of the first and second main surfaces.

According to an embodiment of this presentation, the monolithic piezoelectric member and the spring piezoelectric support members are part of a single piece of shear mode resonating AT- or SC-cut quartz; and each of the at least two spring piezoelectric support members comprises at least first and second arms extending generally along a first direction, connected by a third arm extending generally along a second direction perpendicular to the first direction.

According to an embodiment of this presentation, the MEMS resonator further comprises a cap wafer covering the piezoelectric resonator, such that the baseplate wafer and the cap wafer form a vacuum enclosure of the piezoelectric resonator.

According to an embodiment of this presentation, the cap wafer comprises a single wafer having a cavity forming a wall surrounding the piezoelectric resonator and the wall is bonded to the baseplate wafer to enclose the piezoelectric resonator in a vacuum.

According to an embodiment of this presentation, the wall is bonded to the baseplate wafer using an Au/Sn solder seal.

According to an embodiment of this presentation, the support members are attached to the baseplate wafer by a solder bond performed at wafer level.

According to an embodiment of this presentation, the piezoelectric resonator is several mms in lateral dimensions.

According to an embodiment of this presentation, the monolithic piezoelectric member comprises first and second electrodes on the first and second main surfaces; and at least one of the first and second main surfaces comprises a first trench recess around respectively the first and second electrodes.

According to an embodiment of this presentation, the first trench recess comprises inner and outer walls, and at least one of the inner walls forms an angle of between plus and minus 15 degrees from the normal with the main surface the first trench recess is formed in.

According to an embodiment of this presentation, the first trench recess forms a mesa supporting a shear-mode resonant frequency of the piezoelectric resonator.

According to an embodiment of this presentation, at least one of said first and second main surfaces comprises a second trench recess around said first trench recess; a metal frame covering at least a portion of the area between the first and second trench recesses An embodiment of this presentation also relates to a method comprising: providing a baseplate wafer; providing a piezoelectric HF-VHF resonator that comprises a monolithic piezoelectric member having at least two separate spring piezoelectric support members integrally extending therefrom, each spring piezoelectric support member having at least a rounded corner; wherein said monolithic piezoelectric member comprises first and second main surfaces joined by side edges; at least one of said side edges forming an angle of between plus and minus 15 degrees from the normal with one of the first and second main surfaces; and attaching said piezoelectric resonator to the baseplate wafer by said support members.

According to an embodiment of this presentation, said providing a piezoelectric HF-VHF resonator that comprises a monolithic piezoelectric member having at least two separate spring piezoelectric support members integrally extending therefrom comprises: plasma-etching said monolithic piezoelectric member and said spring piezoelectric support members out of a single piece of shear mode resonating AT- or SC-cut quartz; wherein each of the at least two spring piezoelectric support members comprises at least first and second arms extending generally along a first direction, connected by a third arm extending generally along a second direction perpendicular to the first direction.

According to an embodiment of this presentation, the method further comprises providing a cap wafer to cover the piezoelectric resonator such that the baseplate wafer and the cap wafer form a vacuum enclosure of the piezoelectric resonator.

According to an embodiment of this presentation, said providing a cap wafer comprises: forming said cap wafer out of a single wafer, said cap wafer having a cavity forming a wall for surrounding the piezoelectric resonator; and bonding said wall to the baseplate wafer in a vacuum to enclose the piezoelectric resonator.

According to an embodiment of this presentation, the method comprises bonding the wall to the baseplate wafer using an Au/Sn solder seal.

According to an embodiment of this presentation, the method comprises attaching the support members to the baseplate wafer by a solder bond performed at wafer level.

According to an embodiment of this presentation, the piezoelectric resonator is several mms in lateral dimensions.

According to an embodiment of this presentation, said providing a piezoelectric HF-VHF resonator that comprises a monolithic piezoelectric member having at least two separate spring piezoelectric support members integrally extending therefrom comprises: forming first and second electrodes on the first and second main surfaces of said monolithic piezoelectric member; and forming a first trench recess around said first electrode on said first main surface or around said second electrode on said second main surface.

According to an embodiment of this presentation, said forming a first trench recess comprises forming trench inner walls and trench outer walls, and wherein at least one of said inner walls forms an angle of between plus and minus 15 degrees from the normal with the main surface the first trench recess is formed in.

According to an embodiment of this presentation, said first trench recess forms a mesa supporting a shear-mode resonant frequency of the piezoelectric resonator.

According to an embodiment of this presentation, the method further comprises forming a second trench recess around said first trench recess on said first main surface or on said second main surface, and forming a metal frame on at least a portion of the area between the first and second trench recesses.

These and other features and advantages will become further apparent from the detailed description and accompanying figures that follow. In the figures and description, numerals indicate the various features; like numerals referring to like features throughout both the drawings and the description.

BRIEF DESCRIPTION OF THE DRAWINGS

FIG. 10A illustrates the variations with temperature of Q as well as of the frequency stability of the quartz plate resonator of FIG. 9.

FIG. 10B illustrates the variations with temperature of the values Rs, Cs and Ls of the equivalent RLC circuit of the quartz plate resonator of FIG. 9.

DETAILED DESCRIPTION

Figure 1:
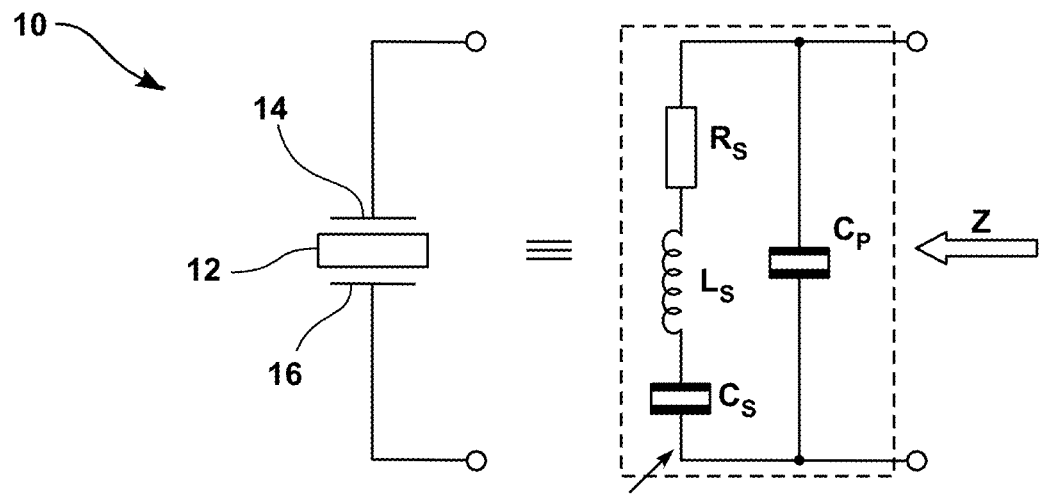
FIG. 1 illustrates a known crystal oscillator as well as its RLC circuit equivalent.

This presentation is intended to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

Embodiments of this presentation relate to a new HF (3-30 MHz)-VHF (30-300 MHz) quartz MEMS resonator design which can have a size of a few (e.g. 1 to 10) millimeters, can have ultra-low resistance (R1), ultra-high Q, and a hysteresis comparable to state-of-the-art resonators. The f/T profile may be comparable to state-of-the-art non-MEMS quartz resonators. In some embodiments, the design has been bonded to a Si ASIC at wafer-level for integrated RF systems. Some keys to this high performance include sidewall slopes within about 15° of vertical on one or more sides, and in some cases on all four sides, which can be achieved using anisotropic plasma etching, the incorporation of integrated quartz springs with at least one rounded angle for isolating the electrodes from mounting stresses over temperature, and the use of a solder (e.g. Au/Sn) wafer-level vacuum sealing process for high temperature bake-outs (up to the limits imposed by the Si electronics). The term "vertical" is used here considering that the main surfaces of the piezoelectric resonator are "horizontal". It can be replaced by the term "normal to the main surfaces of the piezoelectric resonator". In some embodiments, the sidewall slopes may be within 10 degrees of vertical. In other embodiments, the sidewall slopes may be within 5 degrees of vertical. In some embodiments, at least one trench etch forming a recess in the quartz around the electrodes can be used for modal confinement. According to an embodiment of this presentation, the integrated quartz springs having at least a "rounded angle" means that each quartz spring comprises at least two joined elongated arms, a vertical projection of the junction of the two elongated arms forming an arc of a circle on a horizontal plane. Such rounded angles can for example be obtained by shaping etching masks appropriately, then etching the quartz vertically along the edges of the masks.

Small resonator designs may require a dimensional control on sidewalls, plate dimensions, and recess etches of the order of a few microns in order to maintain high fidelity of the acoustical modes for high Q and ideal f/T profiles. As outlined above, for some embodiments this can be achieved with plasma etching, as opposed to wet etching which produces undercutting (dimensional changes) and highly sloped and asymmetric sidewalls on the various plate edges. The inventors have noted that MEMS resonators according to embodiments of this presentation benefit from the synergic combination of the high Q and ideal f/T profiles brought by the sidewall slopes within about 15° of vertical; of the temperature stability, lower aging and lower hysteresis provided by integrated springs having rounded angles; and eventually of a lower hysteresis provided by a wafer-level vacuum sealing with high bake-out temperatures. Optionally, MEMS resonators according to embodiments of this presentation additionally benefit from the higher Q and higher dimensional tolerances provided by trenches formed around the electrodes.

Figure 3:
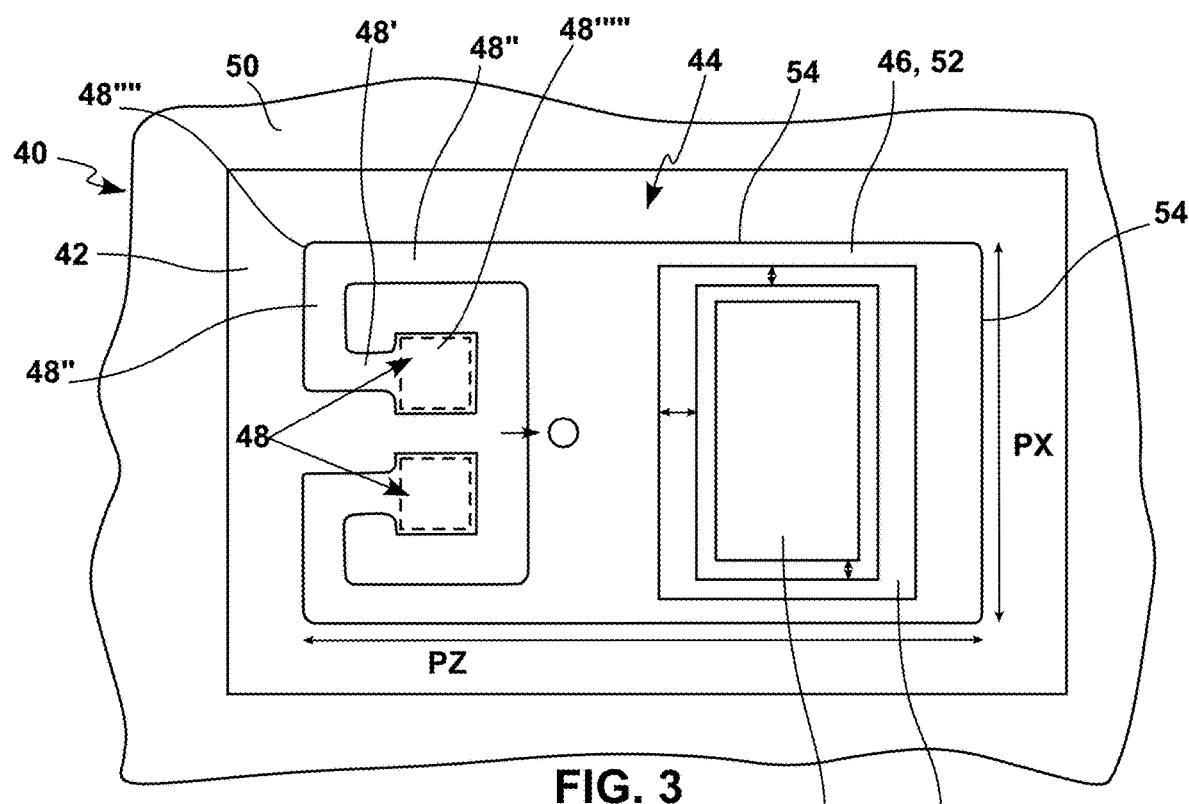
FIG. 3 illustrates a top view of a piezoelectric resonator of a MEMS resonator according to an embodiment of this presentation.

FIG. 3 shows a top cross-section of a MEMS resonator 40 according to an embodiment of this presentation, comprising a baseplate wafer 42; a piezoelectric HF-VHF resonator 44 that comprises a monolithic piezoelectric member 46 having at least two separate spring piezoelectric support members 48 integrally extending from monolithic piezoelectric member 46; said piezoelectric resonator 44 being attached to a protrusion (not shown) of the baseplate wafer 42 by said support members 48. According to an embodiment of this presentation, a cap wafer 50 covers the piezoelectric resonator, such that the baseplate wafer 42 and the cap wafer 50 form a vacuum enclosure of the piezoelectric resonator. According to an embodiment of this presentation, spring piezoelectric support members 48 are "folded" springs comprising at least two arms joined by at least one rounded angle, as illustrated and described in more details hereafter.

According to an embodiment of this presentation, the monolithic piezoelectric member 46 comprises a first main surface (top surface in FIG. 3) 52 and a second main surface (bottom surface, not shown in FIG. 3; see FIG. 4) joined by side edges 54; where at least one of said side edges 54 forms an angle (not shown in FIG. 3; see FIG. 4) of between 90 and 105 degrees (such angles will hereafter equally be called "substantially perpendicular") with one of the first and second main surfaces.

Figure 2:
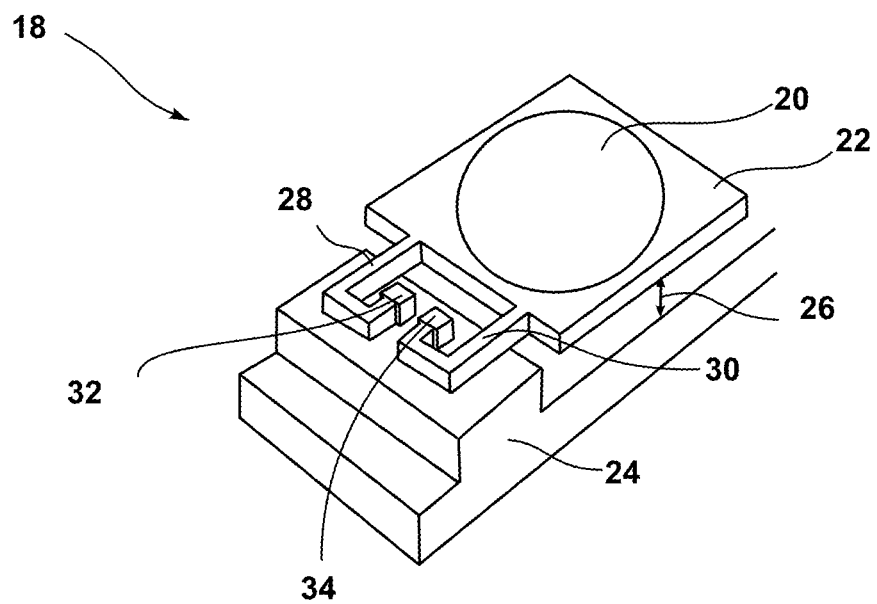
FIG. 2 illustrates a perspective view of a known quartz resonator.

According to an embodiment of this presentation, monolithic piezoelectric member 46 and spring piezoelectric support members 48 are part of a single piece of shear mode resonating AT- or SC-cut quartz. According to an embodiment of this presentation, each of the at least two spring piezoelectric support members 48 comprises at least first and second arms 48', 48" extending generally along a first direction, connected by a third arm 48''' extending generally along a second direction perpendicular to the first direction. According to an embodiment of this presentation, the support members 48 comprise each at least one rounded corner 48"" between the first or third arms or between the second and third arms. According to embodiments of the present invention, all of the arm-to-arm corners of the support members 48 (as well as the corners formed at the junction of the support members 48 and the monolithic piezoelectric member 46 and the corners formed at a junction between first arm 48' and an attachment pad 48""' of the support member) can be rounded. It is noted that the monolithic piezoelectric member 46 is illustrated as being generally rectangular in FIG. 3, but it can also have different shapes. Similarly, electrodes 56, 58 are illustrated as being generally rectangular in FIG. 3, but they can also have different shapes, and for example be circular as shown in FIG. 2.

The radius of the rounded corners of the support members can for example be such that the rounded corners are tangent to the arms at the juncture of the corners and the arms. The radius of the rounded corners can be comprised between 25 micrometer to 100 micrometer; with a preferred value of 50 micrometer in particular for arms 150 to 200 micrometer wide. The radius of the rounded corners can represent 25 to 30% of the width of the spring arms.

Figure 4:
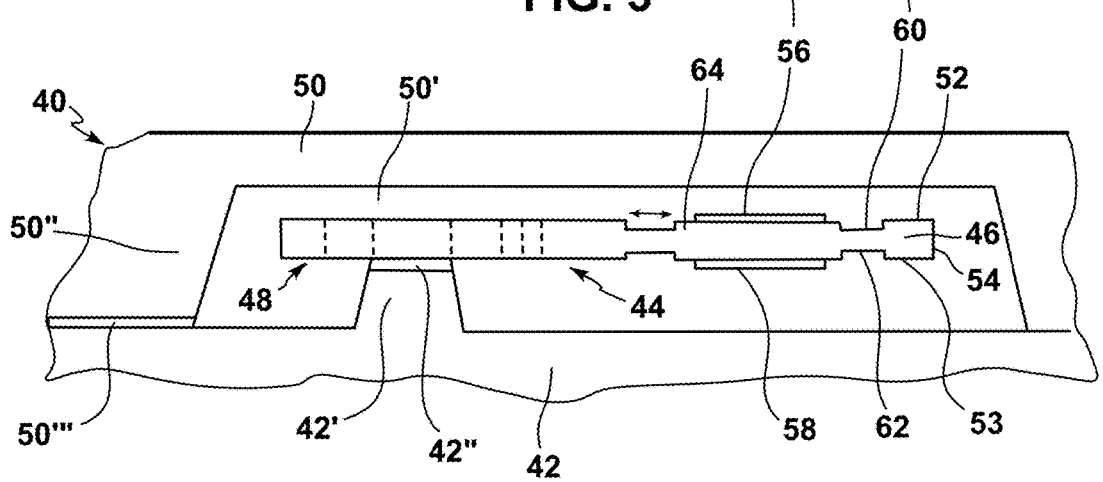
FIG. 4 illustrates a side view of a MEMS resonator according to an embodiment of this presentation.

FIG. 4 is a lateral cross-section of the MEMS resonator 40 shown in FIG. 3, illustrating piezoelectric HF-VHF resonator 44, which comprises monolithic piezoelectric member 46; spring piezoelectric support members 48 integrally extending from monolithic piezoelectric member 46; where piezoelectric resonator 44 is attached to the baseplate wafer 42 by support members 48. FIG. 4 shows that baseplate wafer 42 can comprise a protrusion 42' on which attachment pads 48""' of support members 48 are attached. MEMS resonator 40 further comprises cap wafer 50, which covers the piezoelectric resonator 44 such that the baseplate wafer 42 and the cap wafer 50 form a vacuum enclosure of the piezoelectric resonator. According to an embodiment of this presentation, cap wafer 50 can comprise a single wafer having a cavity 50' forming a wall 50" surrounding the piezoelectric resonator 44; the wall 50" being bonded to the baseplate wafer 42 to enclose the piezoelectric resonator 44 in a vacuum. According to an embodiment of this presentation, the wall 50" can be bonded to the baseplate wafer 42 using an Au/Sn solder seal 50'''. According to an embodiment of this presentation, the vacuum can be of a torr or less for reaching the highest Q.

FIG. 4 also illustrates that the monolithic piezoelectric member 46 comprises a first main surface (top surface) 52 and a second main surface (bottom surface) 53 joined by side edges 54; where at least one of said side edges 54 forms an angle of between 90 and 105 degrees with one of the first and second main surfaces. Preferably, all of the edges 54 form an angle of between 90 and 105 degrees with one of the first and second main surfaces. Preferably, all of the edges 54 form an angle of between 90 and 100 degrees with one of the first and second main surfaces. Preferably, all of the edges 54 form an angle of between 90 and 95 degrees with one of the first and second main surfaces. Preferably, all of the edges 54 form an angle of 90 degrees with both the first and second main surfaces. Preferably, edges 44 are formed by plasma etching.

According to an embodiment of this presentation, monolithic piezoelectric member 46 and spring piezoelectric support members 48 can be part of a single piece of shear mode resonating AT- or SC-cut quartz, and that support members 48 can be attached to the baseplate wafer 42 by a solder bond 42" performed at wafer level. According to embodiments of this presentation, piezoelectric resonator 44 can have a length of between 1 and 6 millimeter, a width of between 0.5 and 4 millimeter, and a height of between 0.005 and 0.35 millimeters.

FIG. 4 also illustrates that said monolithic piezoelectric member 46 comprises a first electrode 56 on the first main surface 52 and a second electrode 58 on the second main surface 53. According to embodiments of this presentation, first main surface 52 comprises a first trench recess 60 around first electrode 56; or second main surface 53 comprises a second trench recess 62 around second electrode 58, or both. Trench recesses 60, 62 comprise each inner and outer walls, wherein at least one of said inner walls forms an angle of between plus and minus 15 degrees from the normal with the main surface where the trench recess is formed (between 75 and 105 degrees with the main surface where the trench recess was formed). According to embodiments of this presentation, the trench recesses 60, 62 are etched using the same process as the side edges 54 of the monolithic piezoelectric member, and they can form a same angle with the main surfaces as the side edges do. According to embodiments of this presentation, the trench recesses 60 and/or 62 form a mesa 64 between electrodes 56 and 58 that supports a shear-mode resonant frequency of the piezoelectric resonator 44.

Although an integration of quartz resonator according to embodiments of this presentation with Si ASICs can be desirable for ultimate integration and miniaturization, such quartz resonators can also be bonded to other substrates if needed for higher stability or higher temperature processing.

Embodiments of this presentation provide for a small, ultra-high performance XO or TCXO oscillator with low power requirements (XO operation at 32 MHz of 45 µW, and TCXO operation of several mW), highest reported Q for small AT-cut fundamental mode XOs, SOA Allan Deviation (ADEV), and highest observed temperature stability (see Miniaturized VHF Quartz MEMs Resonator Design Methodology, Kirby et. al 2017 EFTF—International Frequency Control Symposium July 2017 and incorporated by reference herein as though fully set forth). This might provide for one or more of extremely long battery life, low phase noise, and high frequency stability for portable applications.

Oscillators using resonators according to embodiments of this presentation may be used in vehicle navigation systems, radar, GPS, and inertial systems. Commercial quartz resonators are usually packaged in ceramic or metal packages for hybrid bonding to other electronics. This often increases the size of the overall system and limits up-integration. In addition, most all commercial resonators are fabricated with wet etching. For mm-size resonators, this can limit their Q and R1 due to process variations which preclude the use of precise optimized designs. Ultra-high performance HF-VHF commercial quartz resonators are very large (~1 cm in diameter) to increase their geometrical tolerances for high modal confinement (high Q) and modal isolation over temperature (high temperature stability). In some cases, the edges of these larger quartz plate are contoured to improve modal trapping by tumbling in a spinning chamber containing sand. They are usually baked out at s 2500 C, lower than our 3200 upper temperature for a Au/Sn solder seal.

Some Si MEMS clocks have been demonstrated by the company SiTime. These clocks are not integrated with other electronics due to their >1000° C. packaging temperature. In addition, due to the large temperature sensitivity of Si compared to AT-cut quartz, a very large amount of power (~30-90 mW) is used for temperature compensation to ±2 ppm. However, even with this extra processing requirement, the hysteresis of their devices is limited to about 0.2 ppm. Moreover, the best Q values for such known 20-40 MHz resonators is in the 140K range, roughly one half the values achieved by embodiments of this presentation. Finally, due to the much higher R1 of such known devices, lower Q, and extra noise sources in their sustaining circuits, the phase noise and Allan Deviation of such known devices are much higher.

Various embodiments of this presentation incorporate concepts from HRL U.S. Pat. No. 8,765,615 for bonding a VHF quartz resonator to a substrate with active electronics using wafer-level solder bonding, which is hereby incorporated by reference in its entirety; and HRL U.S. Pat. No. 8,912,711 for thermal stress relief of resonators, which is hereby incorporated by reference in its entirety. The Inventors have shown that a combination of said features with substantially vertical edges, eventually in addition to etched trenches and high temperature wafer-level capping, allows producing ultra-small quartz MEMS resonators with high yield having state-of-the-art or better performances. The contributions of these features to the ultimate performance of the oscillator have only recently been clearly understood and demonstrated by a reduction to practice of the new design.

Figures 5A, 5B:
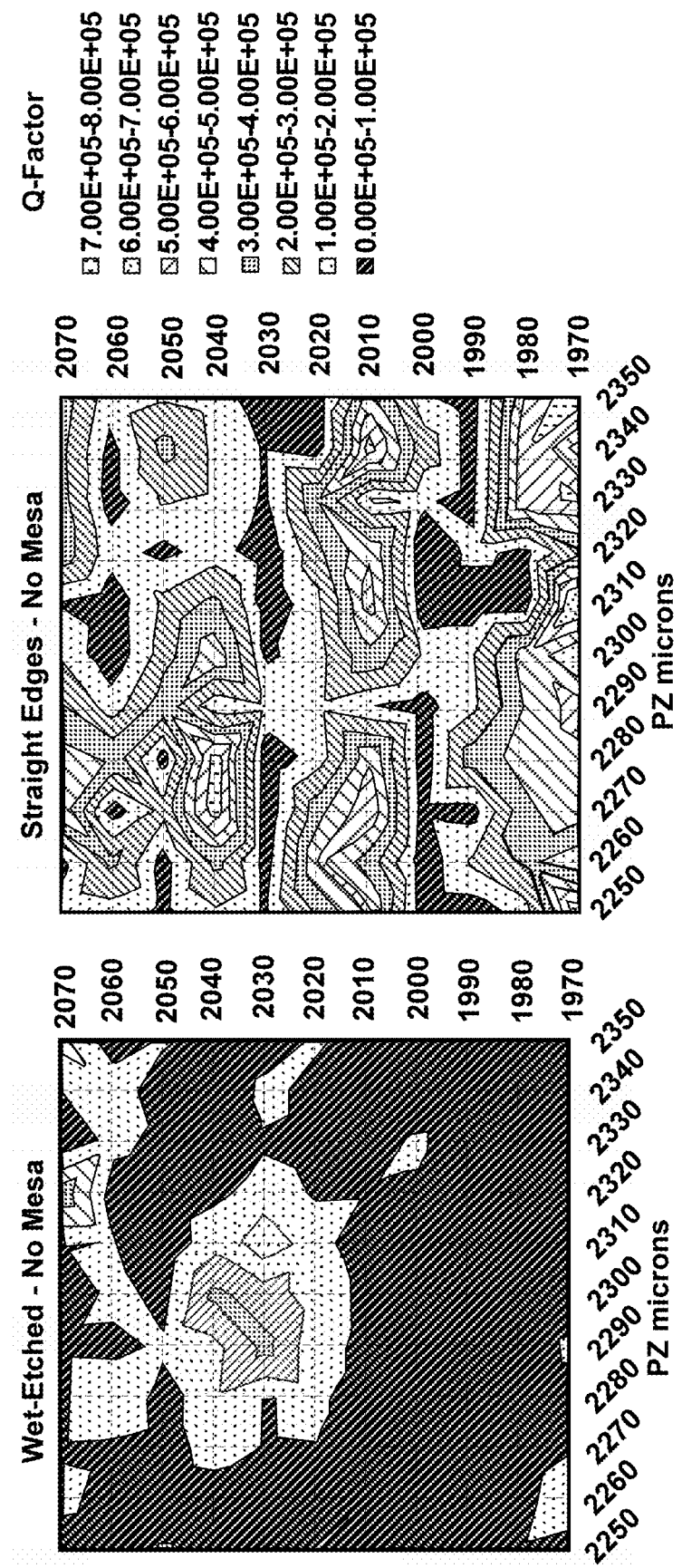
FIG. 5A illustrates the variations of Q with the dimensions of a resonator having its sidewalls wet etched.
FIG. 5B illustrates the variations of Q with the dimensions of a resonator having its sidewalls dry etched.

Embodiments of this presentation provide for using plasma etching for precise control of the sidewall profiles and the dimensional control of the quartz plate. FIGS. 5A and 5B illustrate the results of COMSOL modeling of a small 16-MHz resonator showing the Q versus crystal X and Z dimensions, respectively for wet (5A) and dry (5B) etching. The dimensions on the plots in FIGS. 5A and 5B represent as-fabricated dimensions on the top side of the quartz after etching and bonding to the substrate. The sidewall angles for the wet etched resonators in FIG. 5A vary on each side of the plate due to the anisotropic nature of quartz. However, the sidewall slope for the plasma etched resonators of FIG. 5B was within 5° off vertical for one or more sides. In some embodiments of this presentation, the sidewall slope may be within 5 degrees of vertical for all four sides. The number of sides may vary in other embodiments.

According to embodiments of this presentation, symmetry can be achieved in one fabrication step. The plasma etched sidewalls according to embodiments of this presentation illustrated in FIG. 5B had slopes only 5° off of vertical, but slopes within roughly 15° off vertical are acceptable for some designs. As shown in FIGS. 5A and 5B, there is a large improvement in the Q of the resonator for the devices with the more vertical sidewalls.

Figure 6A:
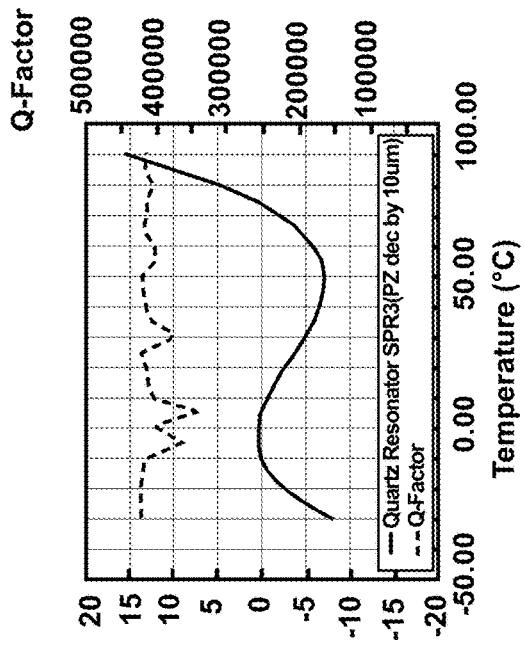
FIG. 6A illustrates the variations with temperature of Q as well as of the frequency stability of a first known quartz plate resonator.
Figure 6B:
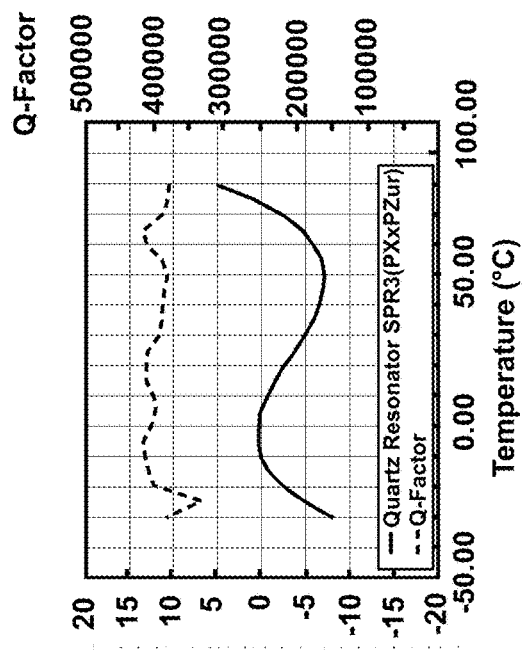
FIG. 6B illustrates the variations with temperature of Q as well as of the frequency stability of the quartz plate resonator of FIG. 6B after a +10 μm change of the length of the quartz plate.

FIGS. 6A and 6B respectively show COMSOL models of the degradation of the expected quadratic/cubic f/T profiles of 32-MHz resonators before and after an increase of 10s of microns in the lateral plate dimensions.

Figure 7A:
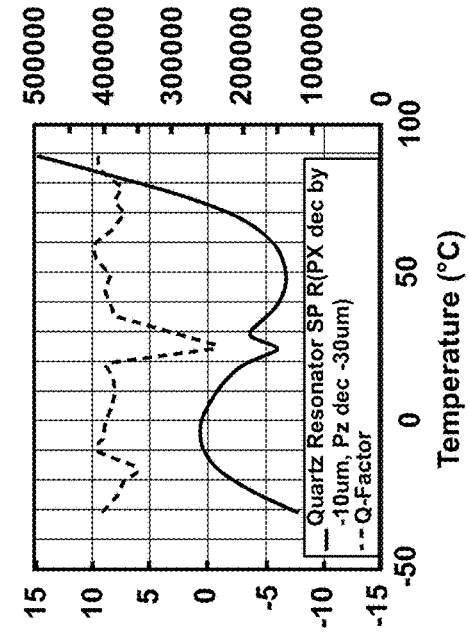
FIG. 7A illustrates the variations with temperature of Q as well as of the frequency stability of a second known quartz plate resonator.
Figure 7B:
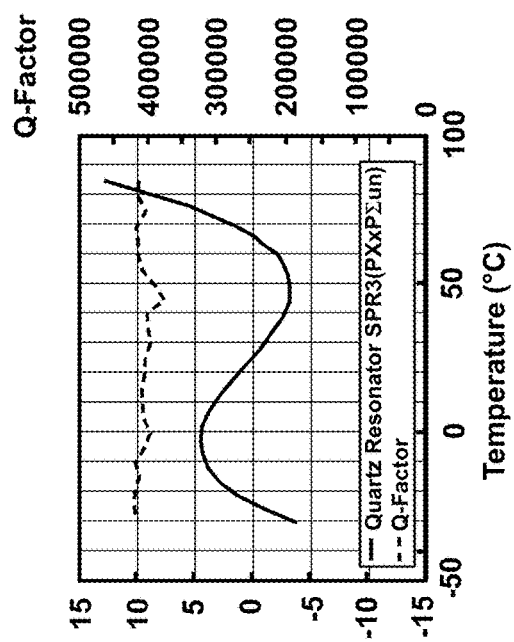
FIG. 7B illustrates the variations with temperature of Q as well as of the frequency stability of the quartz plate resonator of FIG. 7B after a −30 μm change of the length of the quartz plate, combined with a −10 μm change in the quartz plate width.

FIGS. 7A and 7B respectively show COMSOL models of the degradation of the expected quadratic/cubic f/T profiles of 32-MHz resonators before and after a decrease of 10s of microns in the lateral plate dimensions.

It is noted that because 32-MHz shear-mode resonators are roughly 50-µm thick, variations in the plate dimensions of 10s of microns using wet etching is difficult to control wafer-to-wafer.

Embodiments of this presentation provide forming a trench etch/recess 60, 62 around the active resonator electrodes 56, 58. This trench produces a quartz mesa 64 under the electrodes. This mesa supports a lower frequency fundamental mode than can be excited in the trench region. Thus, the fundamental shear acoustic mode under the electrodes 56, 58 is trapped by the trench region with only an evanescent wave existing in the trench. By properly etching the trench to an optimal depth and width, the Q of the resonator can be optimized and stabilized versus small changes in the mesa and plate dimensions.

Figure 8A:
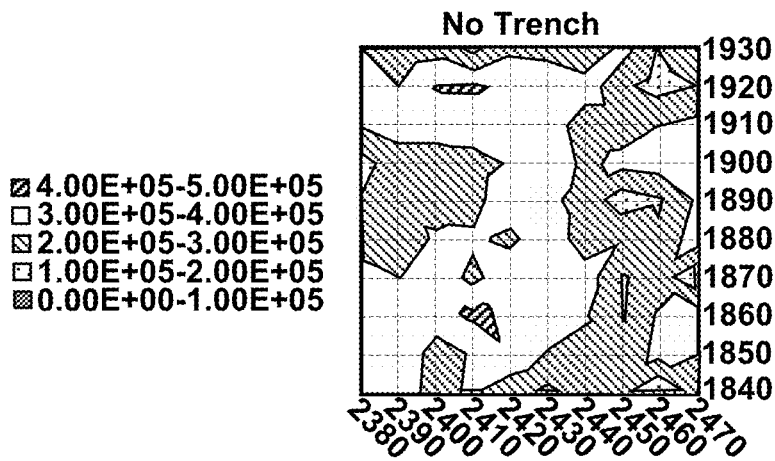
FIG. 8A illustrates the variations of Q with the dimensions of a resonator without a trench.
Figure 8B:
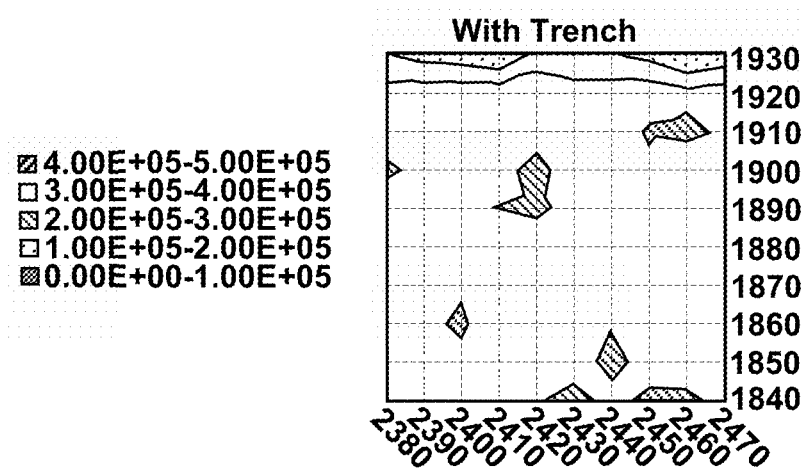
FIG. 8B illustrates the variations of Q with the dimensions of a resonator with a trench.

FIGS. 8A and 8B are diagrams showing examples of this Q improvement, by showing respectively the Q for resonators having the illustrated dimensions with no trench and the Q for resonators having the illustrated dimensions with a trench. Again, plasma etching the trench produces symmetry and control in the trench dimensions.

Figure 9:
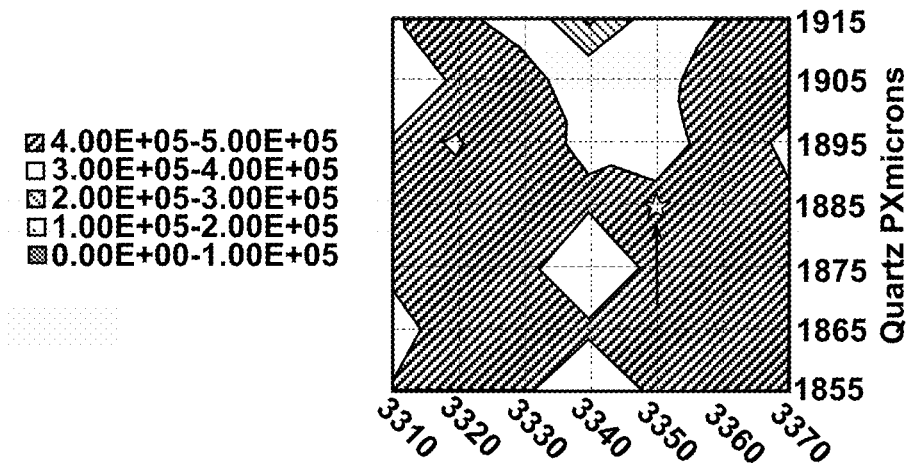
FIG. 9 illustrates the variations of Q with the dimensions of a resonator according to an embodiment of this presentation.

FIG. 9 is a diagram of the variation of Q for resonators according to embodiments of this presentation, with trenches in addition to the spring supports 48. FIG. 9 illustrates how such a diagram can be used to pick the width Px of a quartz resonator (here 1885 Microns) so that for example variations of its length Pz result in no change of its Q factor.

FIG. 10A illustrates the f/T and Q/T profiles of the resonator of FIG. 9; and FIG. 10B illustrates the variations with temperature of the values Rs, Cs and Ls of the equivalent RLC circuit of the quartz plate resonator of FIG. 9.

Figure 11:
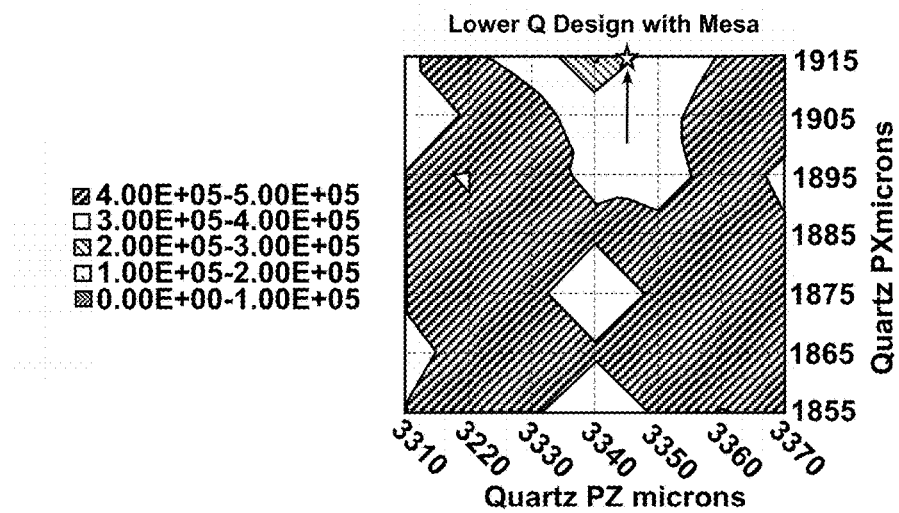
FIG. 11 illustrates the lowest Q achieved with the quartz plate resonator of FIG. 9.

FIG. 11 illustrates the worst dimensioning that can be chosen for a resonator according to embodiments of this presentation, where a length Pz of about 3345 microns and a width Px of 1915 micros lead to having the minimal Q obtainable for the simulated design.

Figure 12A:
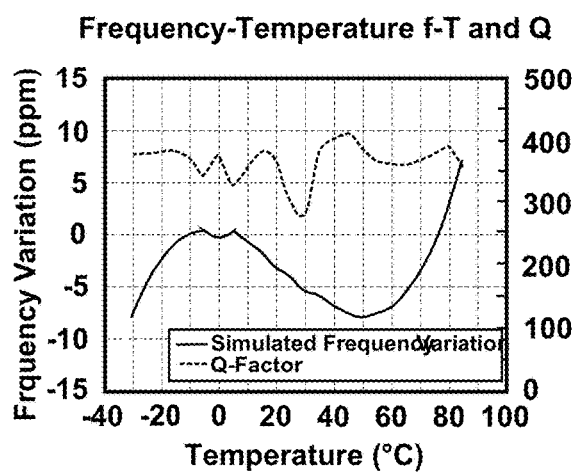
FIG. 12A illustrates the variations with temperature of Q as well as of the frequency stability of a quartz plate resonator having said lowest Q.
Figure 12B:
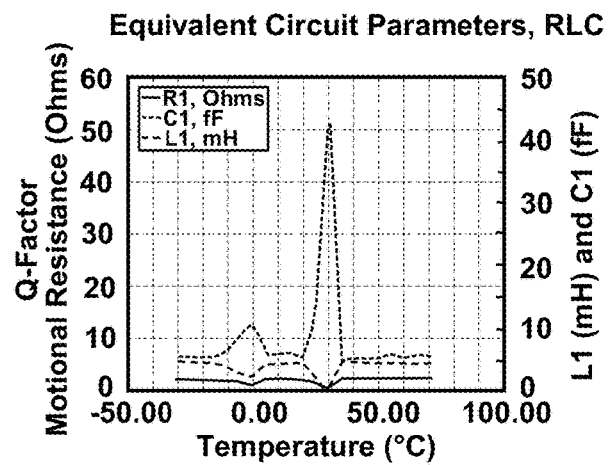
FIG. 12B illustrates the variations with temperature of the values Rs, Cs and Ls of the equivalent RLC circuit of the quartz plate resonator of FIG. 12A.

FIGS. 12A and 12B illustrate respectively the f/T and Q/T profiles of the resonator of FIG. 11; and the variations with temperature of the values Rs, Cs and Ls of the equivalent RLC circuit of the quartz plate resonator of FIG. 11.

The figures illustrate that for the resonator of FIG. 11 modal activity from spurious modes in close proximity with the thickness shear mode degrade the frequency stability and the device Q. The corresponding f/T curve of FIG. 12A is observed to be noisy and contains activity dips. As shown in FIG. 12B, the equivalent circuit (RLC) values for this non-optimized device are also no longer well-behaved and show significant activity close to T=0° C. and T=30° C. This also illustrates that Q contour plots such as in FIG. 11 can be very useful in optimizing new resonator designs.

Figure 13A:
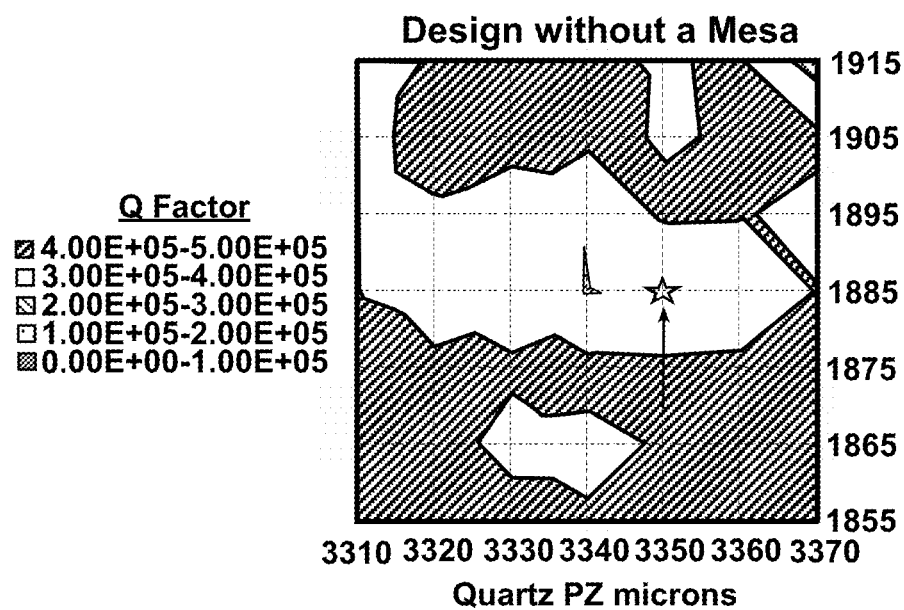
FIG. 13A illustrates the variations of Q with the dimensions of a resonator not having an electrode-surrounding trench according to an embodiment of this presentation.
Figure 13B:
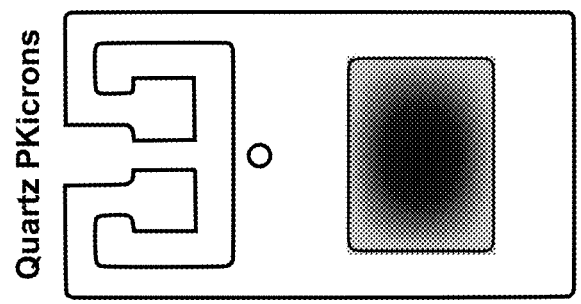
FIG. 13B is a top view of a quartz resonator not having an electrode-surrounding trench according to an embodiment of this presentation.

FIGS. 13A and 13B illustrate respectively the Q-contour plot of a resonator according to an embodiment of this presentation (PX=1885 um, PZ=3350 um), which has no trench around its electrodes; and a top-view schematic of such resonator.

Figure 14A:
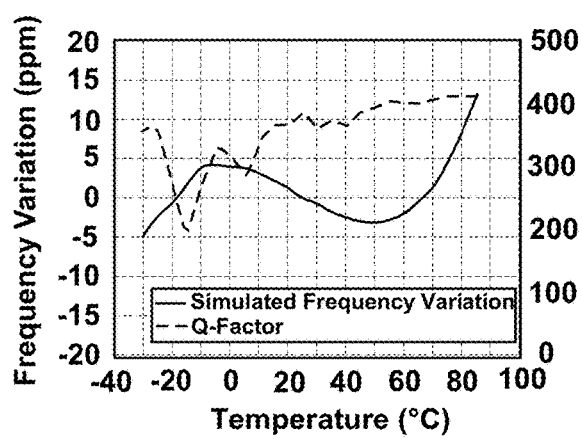
FIG. 14A illustrates the variations with temperature of Q as well as of the frequency stability of the resonator of FIG. 13B.
Figure 14B:
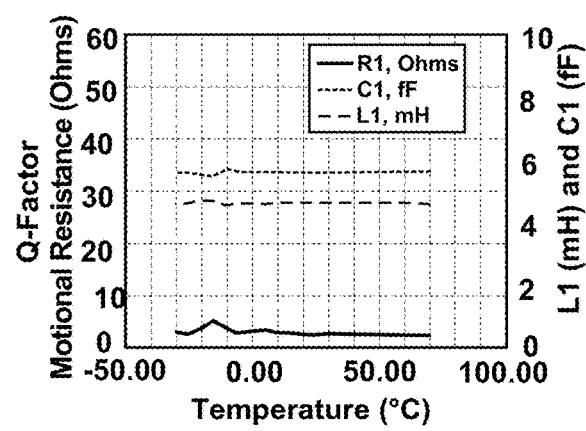
FIG. 14B illustrates the variations with temperature of the values Rs, Cs and Ls of the equivalent RLC circuit of the resonator of FIG. 13B.

FIG. 14A shows the predicted f/T and Q of this 'no-mesa' resonator, and FIG. 14B illustrates the variations with temperature of the values Rs, Cs and Ls of the equivalent RLC circuit of the resonator. In the illustrated examples, modal activity appears at lower temperatures, centered at approximately T=−15° c.

Residual thermal stress coupled into the device from the mounting regions also plays a prominent role in disturbing a well-designed f/T performance.

Figure 15A:
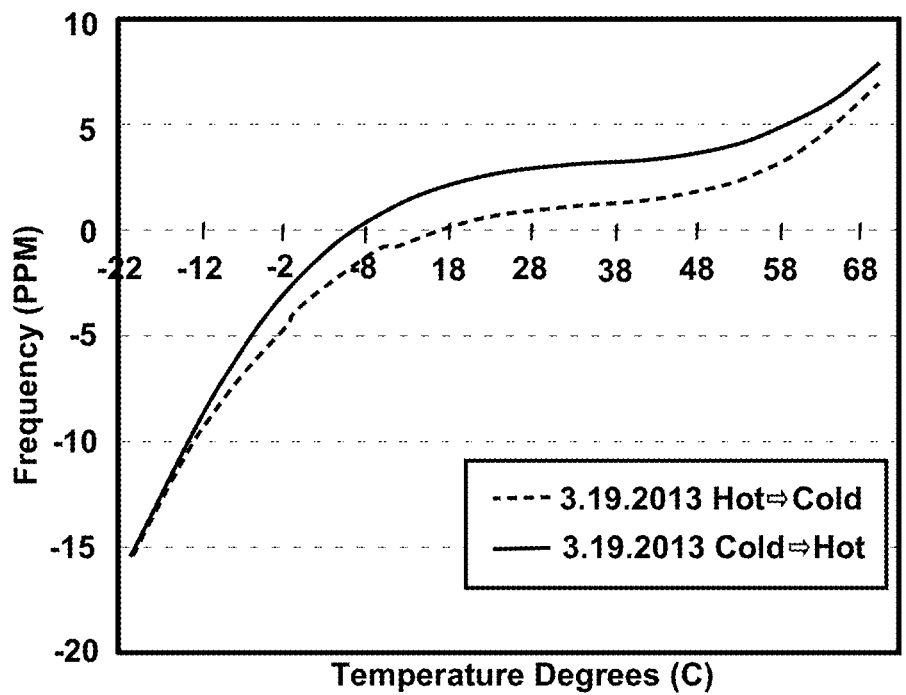
FIG. 15A illustrates the frequency stability of a resonator with no spring mounts after capping, for increasing and decreasing temperature.
Figure 15B:
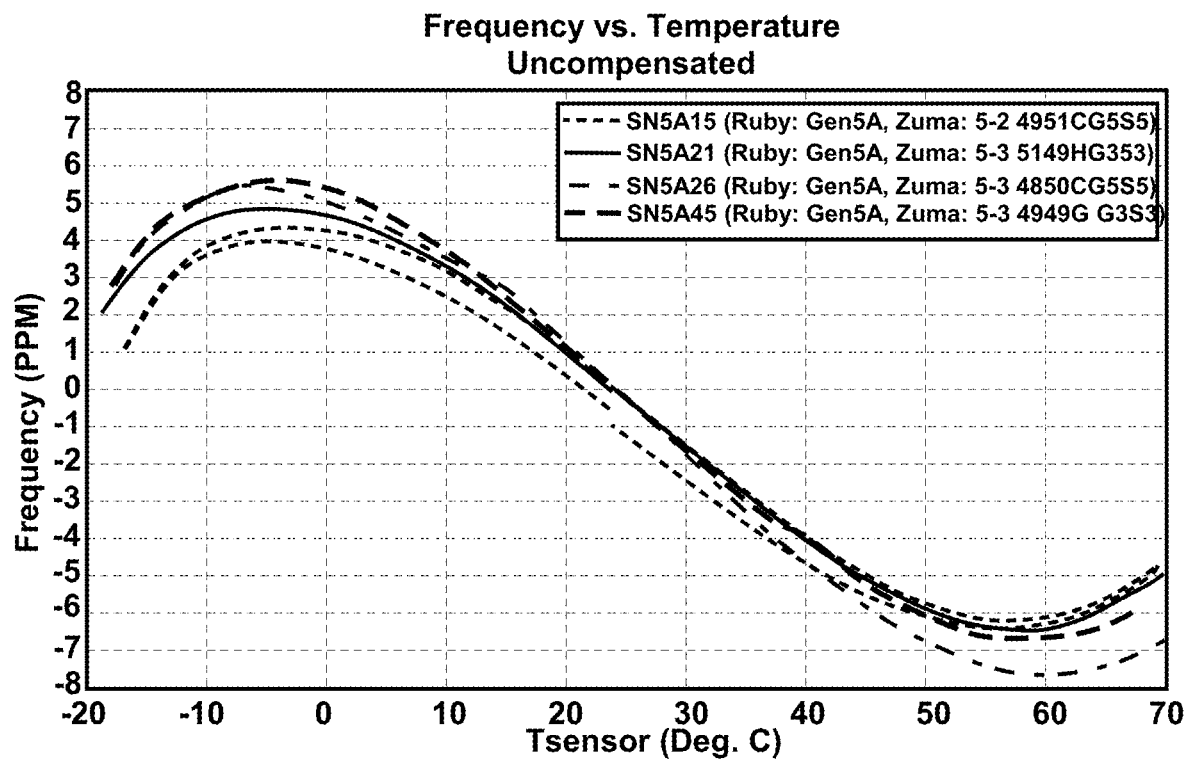
FIG. 15B illustrates the frequency stability of a resonator such as illustrated in FIG. 3 with different cappings.

As detailed above, embodiments of this presentation provide for using spring supports 48 that have at least one rounded corner 48'''', to isolate the resonator from mounting stresses. The Inventors have noticed that in addition to helping produce more classical f/T profiles as described in HRL U.S. Pat. No. 8,912,711, this design also surprisingly improves significantly the hysteresis of the resonator. FIG. 15A illustrates the f/T profile of a 32-MHz resonator having no spring-mounts after vacuum encapsulation with a lower temperature Au/In process. The f/T profile shows a notable hysteresis. FIG. 15B illustrates the f/T profiles of 32-MHz resonators having spring-mounts after vacuum encapsulation with lower temperature as well as higher temperatures. Since stress relaxation at the mounts can contribute to the observed hysteresis, the spring mounts isolate the resonator from these changes over time, thus reducing the hysteresis. The lower curve in FIG. 15B, which relates to a spring-mount resonator encapsulated at low temperature, shows some hysteresis but far less than the no-spring-mount resonator encapsulated at low temperature of FIG. 15A.

Embodiments of this presentation provide for using a high temperature vacuum encapsulation process. The temperature limits are only set by the thermal degradation limits of the quartz resonator or ASIC on which the quartz resonator is assembled to. A quartz resonator and its solder bond to a Si substrate can withstand bake-outs of >400° C. However, at temperatures above 500° C. the quartz can undergo a crystalline phase transition (twin) which destroys its piezoelectric properties. For CMOS electronics, the maximum temperature for anneals is roughly 350° C. for 1 hour. Thus, staying 10° C. to 20° C. under these maximum temperatures may be required. It is known that higher temperature bake-outs can drive off impurities on the quartz resonator surface which can adsorb and desorb over temperature cycling and thus change the frequency of the resonator through mass loading effects. Thus, higher temperature processes are generally desirable.

A comparison of the hysteresis for devices packaged with a wafer-level Au/In process with a maximum temperature of 220° C. (device #SN5A 15) with those packaged with a Au/Sn wafer-level process with a maximum temperature of 340° C. according to embodiments of this presentation is shown in FIG. 15B. All devices had spring mounts in FIG. 15B. Although the spring mounts reduced much of the hysteresis seen in FIG. 15A, the lowest hysteresis was obtained on resonators with spring mount designs which were encapsulated at the higher temperature, and is barely noticeable in FIG. 15B. Using resonators with all of the above-described features, the Inventors have measured the interconnect resistance between the bond pads and the resonator electrodes. This resistance is typically 12 ohms (including interconnect resistance on the ASIC). Subtracting this resistance from the measured R1 values for the resonators, yielded inherent R1 values of 32-MHz designs according to embodiments of this presentation of about 3 ohms, or Qs of about 250 K. This is the lowest R1 values and the highest Qs ever observed for small mm-size 32-MHz resonators and is within a factor of two of the model predictions.

In view of the above, an embodiment of this presentation can comprise a method comprising: generating a Q plot for a design of a piezoelectric resonator having spring support members and a predetermined resonating frequency; choosing on the plot the resonator dimensions that warrant the highest, most stable Q; and fabricating said resonator using plasma etching with edges not more than 15 degrees off the normal of the main surfaces of the resonator. The piezoelectric resonator can then be assembled on a baseplate wafer (i.e. ASIC) by its spring supports, then vacuum encapsulated under a hollowed cap wafer at 480 to 490 Celsius for a quartz resonator.

Figure 16:
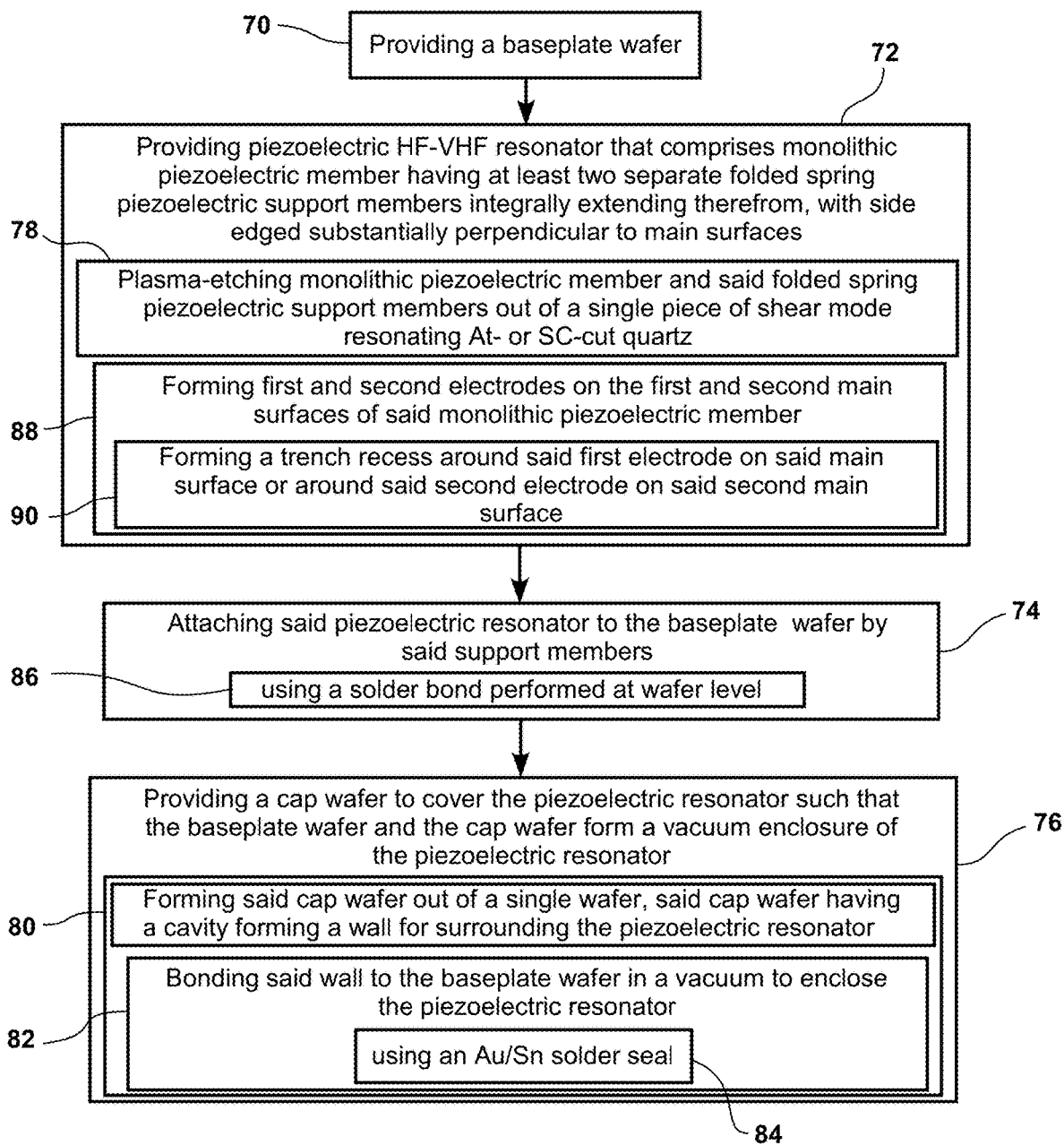
FIG. 16 illustrates a method of manufacturing a MEMS resonator according to embodiments of this presentation.

FIG. 16 illustrates a method of manufacturing a MEMS resonator according to embodiments of this presentation; the method comprising:

providing (70) a baseplate wafer;

providing (72) a piezoelectric HF-VHF resonator that comprises a monolithic piezoelectric member having at least two separate spring piezoelectric support members integrally extending therefrom, each spring piezoelectric support member having at least a rounded corner; wherein said monolithic piezoelectric member comprises first and second main surfaces separated by side edges; at least one of said side edges forming an angle of between 90 and 105 degrees with one of the first and second main surfaces; and attaching (74) said piezoelectric resonator to the baseplate wafer by said support members.

Optionally, the method further comprises providing (76) a cap wafer to cover the piezoelectric resonator such that the baseplate wafer and the cap wafer form a vacuum enclosure of the piezoelectric resonator.

According to embodiments of this presentation, said providing (72) a piezoelectric HF-VHF resonator that comprises providing a monolithic piezoelectric member having at least two separate spring piezoelectric support members integrally extending therefrom comprises plasma-etching (78) said monolithic piezoelectric member and said spring piezoelectric support members out of a single piece of shear mode resonating AT- or SC-cut quartz; wherein each of the at least two spring piezoelectric support members is a folded spring that comprises for example at least two arms extending generally along a first direction, connected by a third arm extending generally along a second direction perpendicular to the first direction.

According to embodiments of this presentation, said providing (76) a cap wafer comprises forming (80) said cap wafer out of a single wafer, said cap wafer having a cavity forming a wall for surrounding the piezoelectric resonator; and bonding (82) said wall to the baseplate wafer in a vacuum to enclose the piezoelectric resonator.

According to embodiments of this presentation, said bonding (82) comprises bonding said wall to the baseplate wafer using (84) an Au/Sn solder seal.

According to embodiments of this presentation, said attaching (74) said piezoelectric resonator to the baseplate wafer comprises using (86) a solder bond performed at wafer level.

According to embodiments of this presentation, the piezoelectric resonator is several mms in lateral dimensions.

According to embodiments of this presentation, said providing (72) a piezoelectric HF-VHF resonator that comprises a monolithic piezoelectric member having at least two separate spring piezoelectric support members integrally extending therefrom comprises: forming (88) first and second electrodes on the first and second main surfaces of said monolithic piezoelectric member; and forming (90) a trench recess around said first electrode on said first main surface or around said second electrode on said second main surface.

According to embodiments of this presentation, said forming (90) a trench recess comprises forming trench inner walls and trench outer walls, wherein at least one of said inner walls forms an angle of between plus and minus 15 degrees from the normal with the main surface the trench recess id formed in (an angle of between 75 and 105 degrees with the main surface the trench recess is formed in).

According to embodiments of this presentation, said trench recess forms a mesa supporting a shear-mode resonant frequency of the piezoelectric resonator.

Figure 17B:
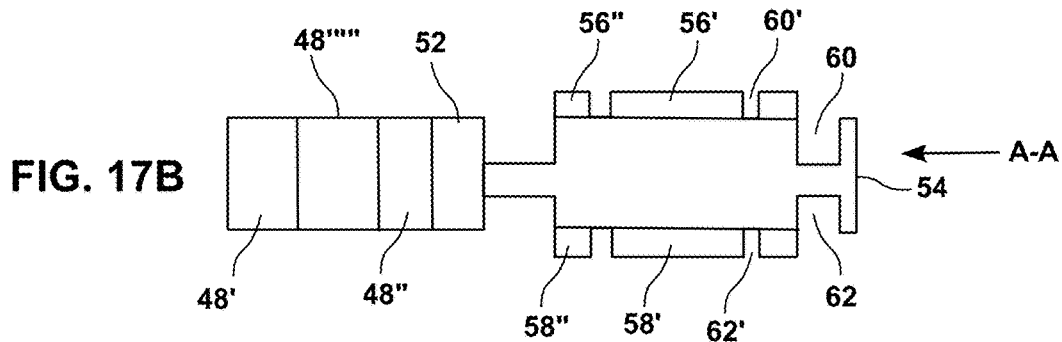
FIGS. 17A and 17B respectively illustrate a top view and a cross-section view of a piezoelectric resonator of a MEMS resonator according to an embodiment of this presentation.
Figure 17A:
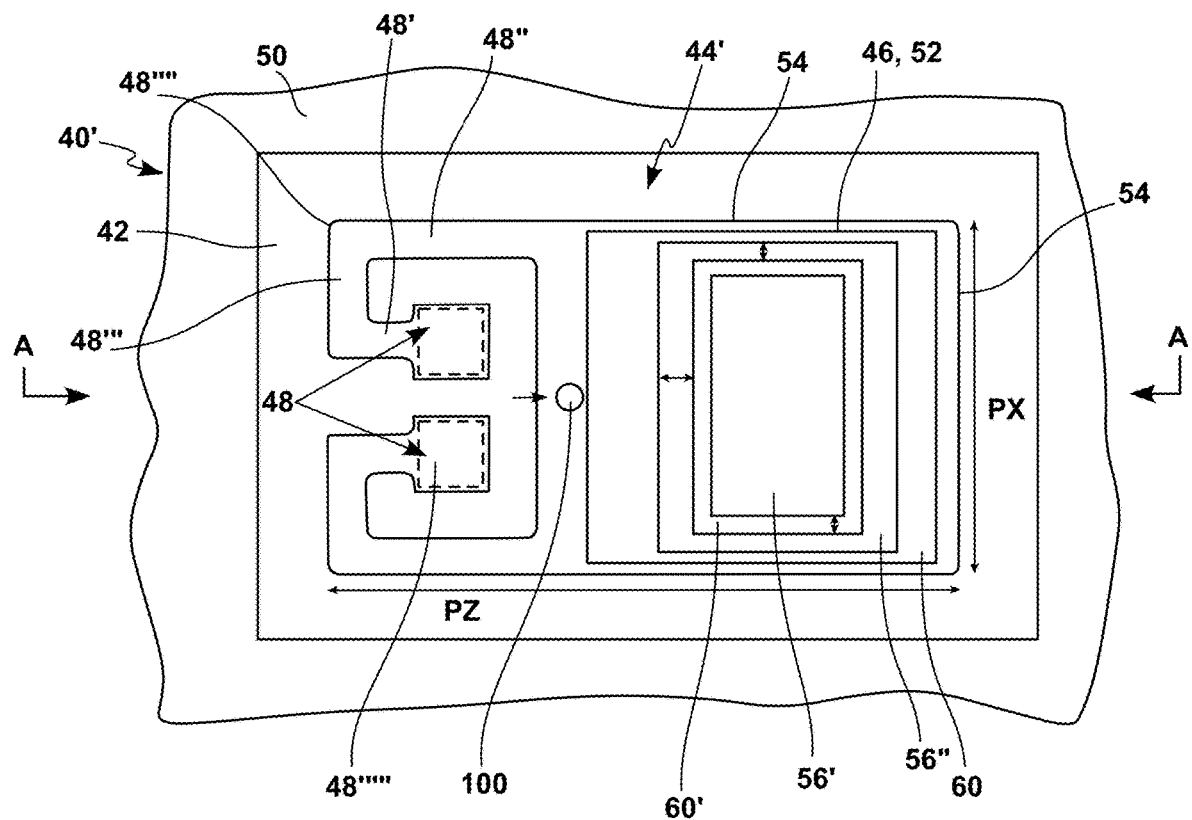

FIG. 17A illustrates a top view a piezoelectric resonator of a MEMS resonator 40' according to an embodiment of this presentation. MEMS resonator 40' is similar to the MEMS resonator 40 illustrated in FIG. 3, and same references correspond to same features in both figures. MEMS resonator 40' differs from MEMS resonator 40, in that it comprises an piezoelectric resonator 44' identical to the piezoelectric resonator 44, but having an additional trench 60' (top surface; together eventually with a bottom additional trench 62') in the mesa formed by trench 60 (top surface; together eventually with bottom trench 62). According to an embodiment of this presentation, additional trench 60' can be shallower than trench 60 (as illustrated), or can have the same depth. According to an embodiment of this presentation, additional trench 60' can be arranged so as to separate top electrode 56 into a central electrode 56' and a peripheral electrode 56". According to an embodiment of this presentation, central electrode 56' can be connected to a conductor on substrate 42 by a conductive lead running through a gap (not shown) in peripheral electrode 56" then on one of the supports 48. Similarly, additional trench 62' can be arranged so as to separate bottom electrode 58 into a central electrode 58' and a peripheral electrode 58". According to an embodiment of this presentation, central electrode 58' can be connected to a conductor on substrate 42 by a conductive lead running through a gap (not shown) in peripheral electrode 56" then upward through a gap 100 in the quartz then along the other one of the supports 48. According to an embodiment of this presentation, peripheral electrode 56" (and peripheral electrode 58") can be left floating or they can be connected to a ground or to a voltage source.

According to embodiments of this presentation, the additional trench can have a width on the order of a few microns. This makes the peripheral electrode act as a frame around the resonating portion between the central electrodes for confining the resonating modes.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A MEMS resonator comprising:
   a baseplate wafer;
   a piezoelectric HF—VHF resonator that comprises a monolithic piezoelectric member having at least two separate spring piezoelectric support members integrally extending therefrom; each spring piezoelectric support member having at least a rounded corner;
   said piezoelectric resonator being attached to the baseplate wafer by said support members; wherein
   said monolithic piezoelectric member comprises first and second main surfaces joined by side edges; at least one of said side edges forming an angle of between plus and minus 15 degrees from the normal with one of the first and second main surfaces.

2. The MEMS resonator of claim 1, wherein the monolithic piezoelectric member and the spring piezoelectric support members are part of a single piece of shear mode resonating AT- or SC-cut quartz; and wherein
   each of the at least two spring piezoelectric support members comprises at least first and second arms extending generally along a first direction, connected by a third arm extending generally along a second direction perpendicular to the first direction.

3. The MEMS resonator of claim 1, further comprising a cap wafer covering the piezoelectric resonator, such that the baseplate wafer and the cap wafer form a vacuum enclosure of the piezoelectric resonator.

4. The MEMS resonator of claim 3, wherein the cap wafer comprises a single wafer having a cavity forming a wall surrounding the piezoelectric resonator and the wall is bonded to the baseplate wafer to enclose the piezoelectric resonator in a vacuum.

5. The MEMS resonator of claim 4, wherein the wall is bonded to the baseplate wafer using an Au/Sn solder seal.

6. The MEMS resonator of claim 1, wherein the support members are attached to the baseplate wafer by a solder bond performed at wafer level.

7. The MEMS resonator of claim 1, wherein said monolithic piezoelectric member comprises first and second electrodes on the first and second main surfaces; and wherein at least one of said first and second main surfaces comprises a first trench recess around respectively said first and second electrodes.

8. The MEMS resonator of claim 7, wherein said first trench recess comprises inner and outer walls, and wherein at least one of said inner walls forms an angle of between plus and minus 15 degrees from the normal with the main surface the trench recess is formed in.

9. The MEMS resonator of claim 7, wherein said first trench recess forms a mesa supporting a shear-mode resonant frequency of the piezoelectric resonator.

10. The MEMS resonator of claim 7, wherein at least one of said first and second main surfaces comprises a second trench recess around said first trench recess; a metal frame covering at least a portion of the area between the first and second trench recesses.

* * * * *